US011769851B2

(12) United States Patent
Lennon et al.

(10) Patent No.: US 11,769,851 B2
(45) Date of Patent: Sep. 26, 2023

(54) METHOD AND AN APPARATUS FOR TREATING A SURFACE OF A TCO MATERIAL, IN A SEMICONDUCTOR DEVICE

(71) Applicant: NewSouth Innovations Pty Limited, Sydney (AU)

(72) Inventors: Alison Joan Lennon, Rozelle (AU); Vincent Akira Allen, Balgownie (AU)

(73) Assignee: NewSouth Innovations Pty Limited, New South Wales (AU)

(*) Notice: Subject to any disclaimer, the term of this patent is extended or adjusted under 35 U.S.C. 154(b) by 184 days.

(21) Appl. No.: 16/080,055

(22) PCT Filed: Feb. 24, 2017

(86) PCT No.: PCT/AU2017/050164
§ 371 (c)(1),
(2) Date: Aug. 27, 2018

(87) PCT Pub. No.: WO2017/143403
PCT Pub. Date: Aug. 31, 2017

(65) Prior Publication Data
US 2019/0067509 A1 Feb. 28, 2019

(30) Foreign Application Priority Data
Feb. 25, 2016 (AU) ................................ 2016900683

(51) Int. Cl.
*H01L 31/18* (2006.01)
*H01L 31/0216* (2014.01)
(Continued)

(52) U.S. Cl.
CPC .... *H01L 31/1888* (2013.01); *H01L 31/02168* (2013.01); *H01L 31/02366* (2013.01);
(Continued)

(58) Field of Classification Search
CPC ............ H01L 31/1888; H01L 31/1884; H01L 31/02168; H01L 31/022475;
(Continued)

(56) References Cited

U.S. PATENT DOCUMENTS 4,507,181 A * 3/1985 Nath ...................... C25D 7/126
205/91
5,320,723 A * 6/1994 Kawakami ............ H01L 31/208
205/656
(Continued)

FOREIGN PATENT DOCUMENTS

| WO | 2008053464 | 5/2008 | |
|---|---|---|---|
| WO | WO-2014153597 A1 * | 10/2014 | ........... C25D 11/005 |
| WO | 2016000030 | 1/2016 | |

OTHER PUBLICATIONS

International Search Report for Application No. PCT/AU2017/050164 dated Apr. 24, 2017 (3 pages).
(Continued)

*Primary Examiner* — Ryan S Cannon
(74) *Attorney, Agent, or Firm* — Michael Best & Friedrich LLP

(57) ABSTRACT

The present disclosure provides a method for treating a surface portion of a TCO material in a semiconductor device that comprises a structure arranged to facilitate current flow in one direction. To perform the method the surface portion of the TCO is exposed to an electrolyte and a current is induced in the device. The current allows reducing the TCO material in a manner such that the adhesion of a metallic material to the exposed surface portion is improved over the adhesion of the metallic material to a non-exposed surface portion.

18 Claims, 7 Drawing Sheets

(51) Int. Cl.
*H01L 31/0224* (2006.01)
*H01L 31/0236* (2006.01)

(52) U.S. Cl.
CPC .. *H01L 31/022475* (2013.01); *H01L 31/1884* (2013.01); *Y02E 10/50* (2013.01)

(58) Field of Classification Search
CPC ......... H01L 31/2366; H01L 31/022466; H01L 21/288; H01L 21/306; H01L 21/3242; Y02E 10/50; C30B 33/00
USPC ..................................................... 438/57, 98
See application file for complete search history.

(56) References Cited

U.S. PATENT DOCUMENTS

| | | | |
|---|---|---|---|
| 5,863,412 A * | 1/1999 | Ichinose | H01L 31/186 205/652 |
| 2010/0065101 A1 * | 3/2010 | Zaban | H01L 31/022425 136/244 |
| 2011/0265866 A1 * | 11/2011 | Oh | H01L 31/02167 136/255 |
| 2012/0181573 A1 * | 7/2012 | Zaban | C03C 17/36 257/E51.012 |
| 2014/0182675 A1 | 7/2014 | Tokuoka et al. | |
| 2015/0090317 A1 | 4/2015 | Tokuoka et al. | |
| 2016/0064592 A1 * | 3/2016 | Cui | C25D 11/022 136/256 |
| 2017/0133521 A1 * | 5/2017 | Allen | H01L 31/1876 |

OTHER PUBLICATIONS

European Patent Office Search Report for Application No. 17755656.0 dated Oct. 1, 2019 (7 pages).

* cited by examiner

METHOD AND AN APPARATUS FOR TREATING A SURFACE OF A TCO MATERIAL, IN A SEMICONDUCTOR DEVICE

TECHNICAL FIELD OF THE INVENTION

The present invention relates generally to the field of semiconductor device fabrication and, in particular, to a method and an apparatus for treating a surface of a Transparent Conductive Oxide (TCO) material in a semiconductor device.

BACKGROUND OF THE INVENTION

Semiconductor devices often have metallic elements which can be used to create electrical contacts between the devices and other external components. Metallic elements can be also used to interconnect different parts of a semiconductor device.

Solar cells, for example, have metallic electrodes which allow for the extraction of photo-generated charge carriers from the device as an electrical current. These metallic electrodes may consist of a patterned metallic structure, such as a grid of metallic fingers interconnected by busbars, or full planar metallic layers.

Patterned structures are usually used at one or more of the surfaces of the solar cell which are exposed to solar radiation.

Electrochemical metal plating is a viable alternative used to deposit metallic materials to surfaces of solar cells in order to form metallic electrodes. For example, in order to fabricate bi-facial heterojunction solar cells, metal electrodes must be formed on TCO layers disposed at the two sides of the solar cell. These TCO layers generally consist of Indium Tin Oxide (ITO) deposited on the p-type hydrogenated amorphous silicon layer and the n-type hydrogenated amorphous silicon layer of the solar cell.

Silver, which is the dominant metal used in solar cell manufacturing, is one of the most expensive metals. As such, by replacing silver with a less expensive metal, the manufacturing costs of solar cells can be significantly reduced. However, forming metal electrodes to ITO by electrochemical methods has been found to be a challenging task due to adhesion problems of the metal to the ITO. This problem is particularly pronounced for copper electrodes. The adhesion of patterned plated copper electrodes to ITO layers has been found to be poor, as copper that is directly plated to ITO has been found to peel-off after plating or during mask removal. This poor adhesion gives rise to poor electrical performance of the solar cell due to high series resistance. Structural problems can also occur if the copper electrodes peel-off from the ITO.

It would be beneficial to have a method for forming plated copper electrodes to ITO which alleviates the adhesion problem described above.

SUMMARY OF THE INVENTION

In accordance with the first aspect, the present invention provides a method for treating a surface portion of a TCO material in a semiconductor device, the semiconductor device comprising a structure arranged to facilitate current flow in one direction, the method comprising the steps of:
 exposing the surface portion of the TCO material to an electrolyte that is suitable for electrochemically reducing a portion of the TCO material when an electrical current is induced through a region of the TCO material; and
 inducing a current in the TCO material;
 wherein the method is performed in a manner such that the induced current reduces the TCO material and improves adhesion of a metallic material to the exposed surface portion over adhesion of the metallic material to a non-exposed surface portion.

In embodiments, the structure arranged to facilitate current flow in one direction comprises a light absorbing layer and at least one carrier selective layer. For example, the structure may comprise an absorbing layer disposed between an electron selective membrane and a hole selective membrane.

In alternative embodiments, the structure arranged to facilitate current flow in one direction comprises a p-n junction. The step of inducing a current in the TCO material may consist of generating a current in the semiconductor device by, for example 'biasing' the p-n junction. The p-n junction may be biased by exposing it to radiation or by applying a voltage across it.

In some embodiments, the method further comprises the step of electrically interconnecting an electrode element to the semiconductor device. Furthermore, a wet electrode can be positioned in the electrolyte such that the induced current can flow through an electrical circuit comprising: the electrolyte, the semiconductor device, the TCO material, the electrode element and the wet electrode.

At least a portion of the device is kept out of the electrolyte while the method is performed.

In some embodiments the TCO material is arranged as a continuous layer on an n-type or p-type region of the semiconductor device and the induced current flows in a direction transverse to the layer.

Advantageously, this provides a better uniformity of the adhesion properties of the TCO across the layer.

The TCO material may be arranged as a continuous layer on the n-type region of the semiconductor device and the current may be induced by exposing a portion of the semiconductor device to electromagnetic radiation.

In some embodiments, a voltage is applied between the semiconductor device and the wet electrode in the electrolyte to decrease the voltage drop induced by the electromagnetic radiation on the p-n junction.

Advantageously, the applied voltage can be used to compensate the self-biasing of the p-n junction created by the radiation and facilitate current flow.

One or more structural or electrical properties of the surface of the TCO layer may be controlled by modulating a property, such as the magnitude of the induced current. This can be done by modulating the intensity of the radiation or the applied voltage.

Alternatively, the TCO material may be arranged as a continuous layer on a p-type region of the semiconductor device and the current may be induced by applying a forward biasing voltage to the junction using the electrode element.

One or more structural or electrical properties of the surface of the TCO layer may be controlled by modulating a property, such as the magnitude of the applied voltage.

In embodiments, the method is performed in a manner such that the TCO material is etched while the method is performed. The concentration of metallic elements in the TCO material at the surface may also increase while the method is performed. In some cases the roughness of the exposed portion may also increase.

One or more properties of the electrolyte may be purposely selected to influence a property of the surface of the TCO material after treatment.

In some embodiments, prior to exposing the surface of the TCO material to an electrolyte, a mask is formed onto the TCO material to define a patterned surface to be exposed to the electrolyte.

In embodiments, the electrolyte comprises $H_2SO_4$. The weight concentration of $H_2SO_4$ in the electrolyte may be between 0.1% and 10%. The electrolyte may further comprise $Na_2SO_4$ with a weight concentration between 0.05% and 0.25%.

In some embodiments, the overall amount of electrical charge transferred to the TCO material throughout the process is comprised between 1 $mC/cm^2$ and 50 $mC/cm^2$ or, in specific embodiments between 15 $mC/cm^2$ and 25 $mC/cm^2$.

In embodiments, the method may comprise the step of plating a metal to the surface of the TCO material. The plating step may be performed by field induced plating, light induced plating or electroplating.

After performing the method in accordance with the first aspect the adhesion of the plated metal to the TCO is improved.

In some embodiments, the adhesion of the metal to the TCO material is higher than 0.5 N/mm busbar width, when measured with a busbar pull tester.

The adhesion may also be measured by measuring the force required to lift-off a finger of the metal attached to the TCO material using a stylus travelling along the surface of the TCO material towards the finger in a direction transverse to the finger. By using this measurement technique, in embodiments, the force required to lift-off a metal finger is at least 1 N for a finger with a width of at least 30 μm and height of at least 8 μm.

In accordance with the second aspect, the present invention provides a method for plating a metallic material to a TCO material in a semiconductor device, the semiconductor device comprising a p-n junction, the method comprising the steps of:
  exposing the surface of the TCO material to an electrolyte that is suitable for electrochemically reducing the TCO material when an electrical current is induced through a region of the TCO material; and
  inducing a current in the TCO material by biasing the p-n junction;
  allowing for the surface of the TCO material to be reduced by the current and the electrolyte in a manner such that adhesion of the metallic material to the exposed surface is improved;
  plating the metallic material to the surface of the TCO material.

The TCO material may comprise indium tin oxide (ITO) and a portion of $SnO_2$ in the ITO may be reduced to SnO while the method is performed. In addition, a portion of SnO may be reduced to Sn while the method is performed.

In embodiments, the semiconductor device is a silicon solar cell and the method of the first or second aspect is used to form metallic electrodes which allow the extraction of photo-generated charge carriers from the device as an electrical current.

In accordance with the third aspect, the present invention provides a manufacturing apparatus comprising a bath suitable to contain an electrolyte and an electrical arrangement suitable to perform a method in accordance with any one of the preceding claims.

In accordance with the fourth aspect, the present invention provides a photovoltaic cell comprising:
  a p-n junction;
  at least one ITO layer; and
  at least one metallic contact deposited onto the ITO layer;
    wherein the ITO layer has a thickness comprised between 50 nm to 100 nm and is processed in accordance with the method of the first aspect to improve adhesion of the metallic contact to the ITO layer.

In embodiments, the ITO layer comprises $In_2O_3$ and $SnO_2$ and the concentration of $SnO_2$ in the ITO layer is comprised between 5% and 20%.

Advantages of embodiments of the present invention are related to a pre-treatment process performed on a TCO prior to plating. The process can be performed on TCO layers deposited on the n-type regions or p-type regions of heterojunction solar cells. Advantageously, the pre-treatment process is driven by a current that circulates in the solar cell. This can be a photo-generated current, or a current induced by applying a biasing voltage to the cell. This approach allows the "pre-treating current" to be controlled with a high degree of uniformity.

BRIEF DESCRIPTION OF THE DRAWINGS

The embodiments of the invention will now be described, by way of example, with reference to the accompanying drawings in which.

DETAILED DESCRIPTION OF EMBODIMENTS

Embodiments of the present invention relate to a method and an apparatus for treating a TCO material in a semiconductor device so that the adhesion of some metals to the TCO material is improved. Embodiments also relate to a method of plating a metal to a TCO material treated to improve metal adhesion. Some embodiments are directed to photovoltaic devices which comprise TCO layers, such as heterojunction solar cells, where the TCO layers are treated to improve metal adhesion.

The TCO treatment is performed by taking advantage of the properties of a structure arranged to facilitate current flow in one direction in the semiconductor device.

Unlike other methods of treating TCOs, which require a direct mechanical contact to the TCO material, in the method and apparatus disclosed herein the surface of the TCO being treated is exclusively contacted by an electrolyte. In addition, the induced current is not required to flow laterally through the surface layer being treated. Instead the induced current is directed transversally to the surface being treated, therefore enabling uniform adhesion properties.

Figure 1:
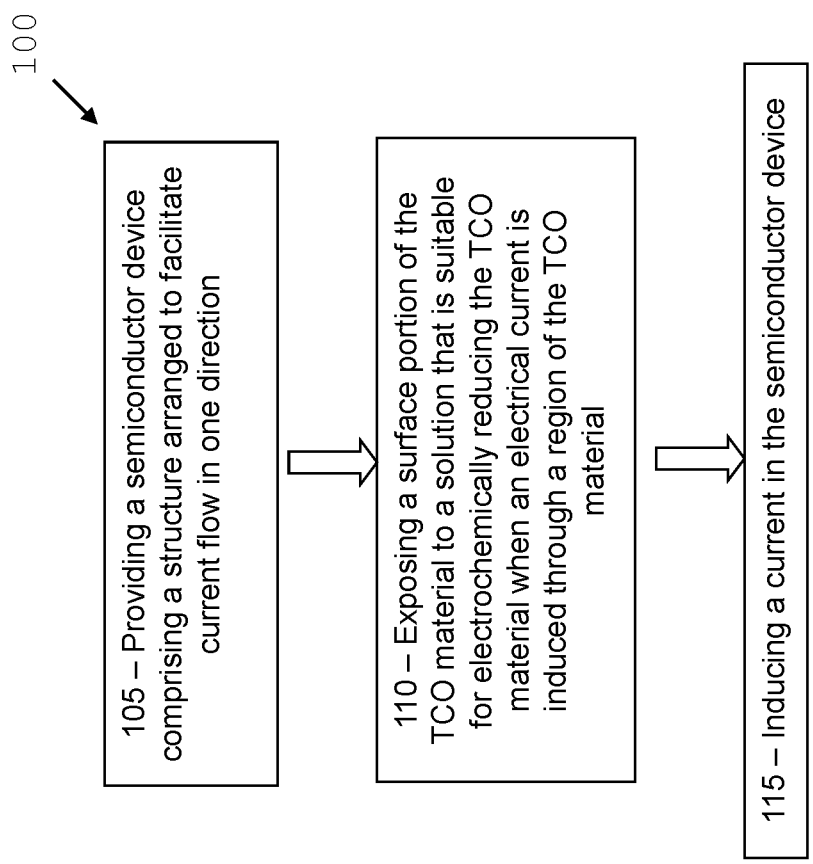
FIG. 1 is a flow diagram outlining steps for treating a surface portion of a TCO material in accordance with embodiments.

Referring now to FIG. 1, there is shown a flow diagram 100 outlining steps for treating a surface portion of a TCO material in accordance with embodiments. At step 105 a semiconductor device comprising a structure arranged to facilitate current flow in one direction is provided. In the case of a solar cell, the structure may comprise an absorbing layer disposed between an electron selective membrane and a hole selective membrane. Alternatively, the structure may comprise a p-n junction, such as in a heterojunction solar cell or a homojunction solar cell.

At step 110, a surface portion of the TCO material is exposed to an electrolyte that is suitable for electrochemically reducing the TCO material when an electrical current is induced through a region of the TCO material.

At step 115, a current is induced in the semiconductor device. The current may be induced by applying a biasing voltage to the semiconductor device or by exposing the semiconductor device to radiation. In some cases the biasing voltage and the radiation are applied simultaneously.

In the case where the semiconductor device is a solar cell, the TCO may be arranged as a continuous layer on an n-type or p-type region of the solar cell. If the method is used to treat a TCO on an n-type region, the current can be induced by exposing the solar cell to electromagnetic radiation. In some instances, the photo-generated current can be sufficient to perform the TCO treatment. In other instances the current flow is facilitated by applying a biasing voltage to the solar cell to compensate for the self-biasing of the p-n junction created by the radiation.

When the method is used to treat a TCO on a p-type region, a forward biasing voltage is necessary to induce the current in the solar cell.

One advantage of the method is that the induced current flows in a direction transverse to the layer, providing uniform reduction of the exposed portion of the TCO and therefore resulting in improved adhesion uniformity. In particular, the current flows through an electrical circuit comprising: the electrolyte, the solar cell and the TCO material. This is discussed in more detail in the next section with reference to FIG. 2.

The current flowing through the electrolyte, the solar cell and the TCO material allows reduction of the TCO material and improved adhesion of some metallic materials, such as copper, to the surface portion of the TCO exposed to the reducing electrolyte. The adhesion is improved relative to the adhesion of the same metal to the same TCO where the TCO has not been treated with the process described above.

Figure 2:
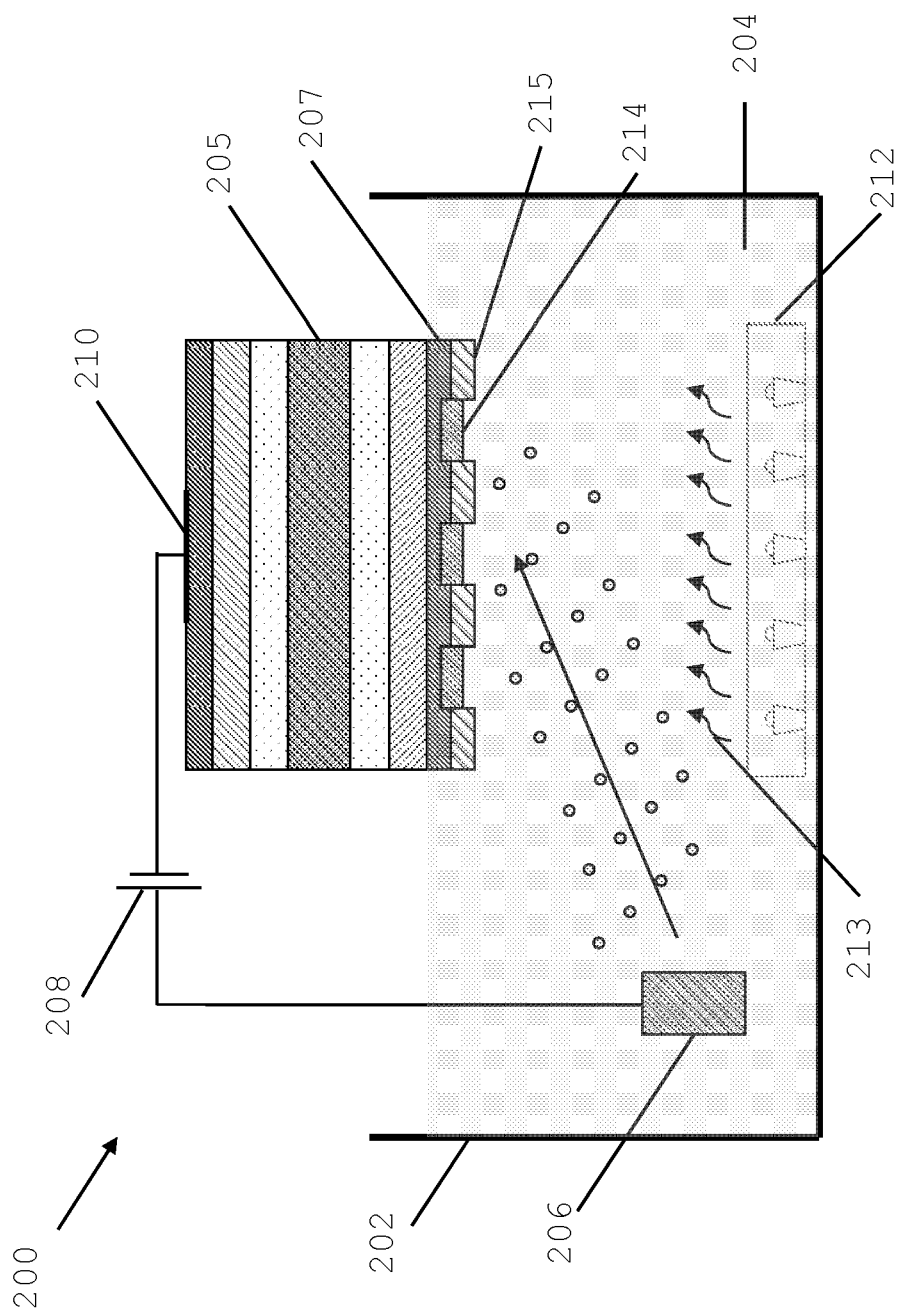
FIG. 2 is a schematic diagram of an apparatus used to perform the method of FIG. 1.

Referring now to FIG. 2, there is shown a schematic diagram of an apparatus 200 used to perform the method of FIG. 1. Apparatus 200 comprises a chemical bath 202 suitable to contain an electrolyte 204. A portion of a TCO layer 207 of a solar cell 205 is exposed to the electrolyte 204. Solar cell 205 can be kept in position using a support in the chemical bath (not shown) or a vacuum holder (not shown). Alternatively, solar cell 205 may float on the surface of the electrolyte 204.

Further, apparatus 200 comprises a wet electrode 206 immersed in the electrolyte and a power supplier 208 for applying a voltage between wet electrode 206 and an electrode element 210 which is in electrical contact with solar cell 205. Apparatus 200 comprises a radiation source 212 which is arranged to expose solar cell 205 to radiation. TCO layer 207 is exposed to the electrolyte, while the remaining portions of solar cell 205, are kept dry while the method is performed.

In the embodiment of FIG. 2, the radiation source 212 is disposed at the bottom of chemical bath 202 and photons 213 travel towards the bottom surface of solar cell 205.

In alternative embodiments, the top side of the device may be contacted using a semi-transparent electrode and the radiation source 212 may be disposed above solar cell 205.

A photo-generated current flows in the circuit comprising: electrolyte 204, solar cell 205, TCO layer 207, electrode 210 and wet electrode 206. The current flows transversally through TCO layer 207 providing a better uniformity of the metal adhesion properties of the TCO across the layer.

A patterned mask 215 is used to select specific areas of TCO layer 205 for treatment. Mask 215 can be formed, for example, by using a photoresist material. A metal can be plated through mask 215 or, alternatively mask 215 can be removed prior to the plating step.

A portion of the TCO layer may be etched while the treatment is performed. The concentration of metallic elements in the treated portions 214 increases during treatment. For example, for ITO layers, a portion of $SnO_2$ in the layer is reduced to SnO in the first instance and to Sn if the method is performed for a sufficient amount of time. The increased concentration of the metallic element, tin in the case of ITO, promotes the adhesion of other metallic materials, such as copper, to the TCO layer.

Electrolyte 204 comprises $H_2SO_4$ with a weight concentration of 1% and $Na_2SO_4$ with a weight concentration of 0.14%. The chemical composition of electrolyte 204 can be varied to affect the final adhesion properties of TCO layer 207.

The adhesion properties and the structural properties of the surface of the treated areas 207 are related to the overall amount of electrical charge transferred to the TCO material. For plating of copper to ITO, an overall charge of 22 $mC/cm^2$ was found to provide good adhesion properties. However, depending on the nature of the TCO and the material being plated, a charge comprised between 1 $mC/cm^2$ and 50 $mC/cm^2$ can be used.

Structural and/or electrical properties of the regions treated 214 can also be controlled by modulating the magnitude of the current flowing through the circuit by changing the intensity of light 213 and/or the magnitude of voltage 208.

Figure 3:
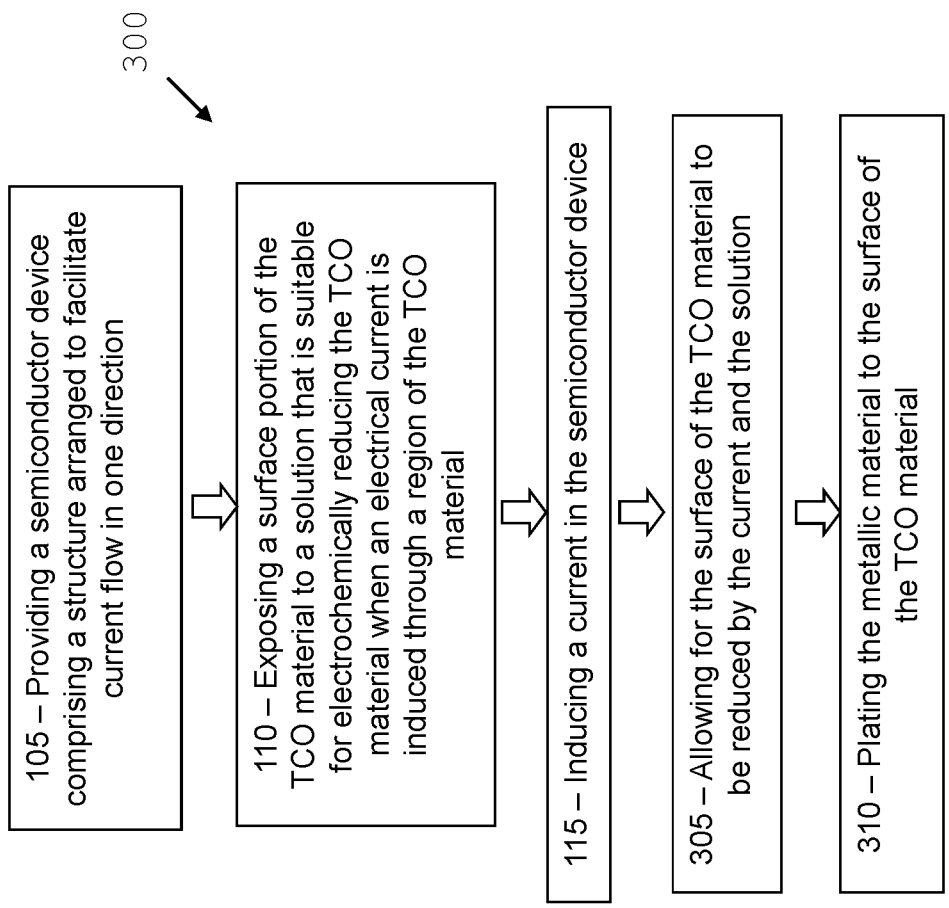
FIG. 3 is a flow diagram outlining steps for plating a metallic material to a TCO material in accordance with embodiments.

Referring now to FIG. 3, there is shown a flow diagram 300 outlining steps for treating a TCO layer and plating a metallic material to the treated TCO layer. At steps 105, 110 and 115, the TCO material is treated as discussed above with reference to FIG. 1. At 305, a sufficient amount of time is allowed for the TCO to be reduced. At step 310 a metal is plated to the treated surfaces by field induced plating, light induced plating or electroplating.

Figure 4:
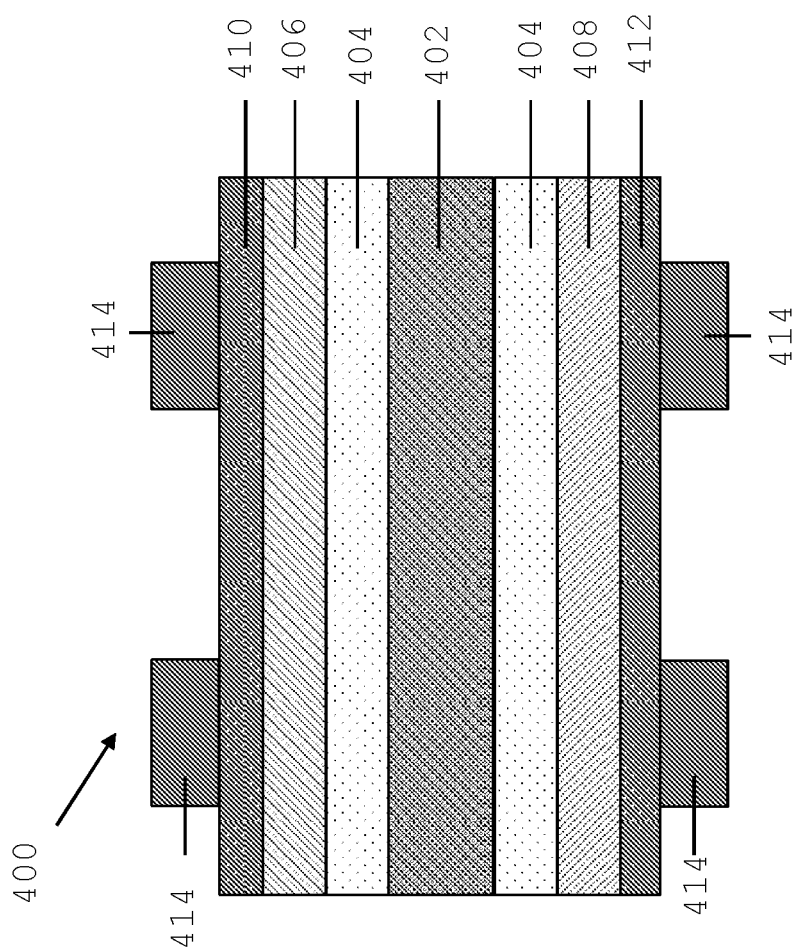
FIG. 4 is a schematic diagram of a solar cell comprising a TCO layer treated in accordance with embodiments.

Referring now to FIG. 4, there is shown a heterojunction solar cell device 400 manufactured using the method of FIG. 3. Solar cell 400 is formed using an n-type crystalline silicon substrate 402 disposed between two hydrogenated intrinsic amorphous silicon layers 404. The device 400 has a p-type hydrogenated amorphous silicon layer 406 on one side and an n-type hydrogenated amorphous silicon layer 408 on the other side. ITO layers 410 and 412 are disposed on the p-type and an n-type hydrogenated amorphous silicon layers 406 and 408. The ITO layers have a thickness comprised between 50 nm to 100 nm and are treated to improve metal adhesion in accordance with the method of FIG. 1.

In addition to their contacting function, the ITO layers are also used as anti-reflective-coatings (ARCs). The control of the current used during the treatment step is crucial as the ITO layers etch during treatment. The applicant found that a low-magnitude current allows a better control of the ITO properties during treatment. Devices for regulating small currents, such as current limiting diodes (CLD) can be used in the treating apparatus. Copper fingers 414 are formed on cell 400 using field induced plating, light induced plating or electroplating.

The adhesion of metallic fingers to TCO materials can be measured using a number of methods such as busbar pull test or a tape test. Currently, an industry standard has not been established to measure adhesion.

The Applicants have engineered a new method to measure adhesion of metal finger to the ITO layers. The method comprises the steps of moving a stylus along the surface of the ITO in a direction transverse to the finger until it encounters a side wall of a metal finger and pushing the finger sideways until it lifts-off.

The adhesion of fingers 414 is improved in comparison to copper fingers plated on an untreated ITO layer. By using the stylus measurement, the force required to lift-off a 30 µm wide metal finger with a height of 8 µm from an untreated ITO layer is less than 0.2N. Whereas in accordance with the method of FIG. 3 the force measured is at least 1N.

Figure 5B:
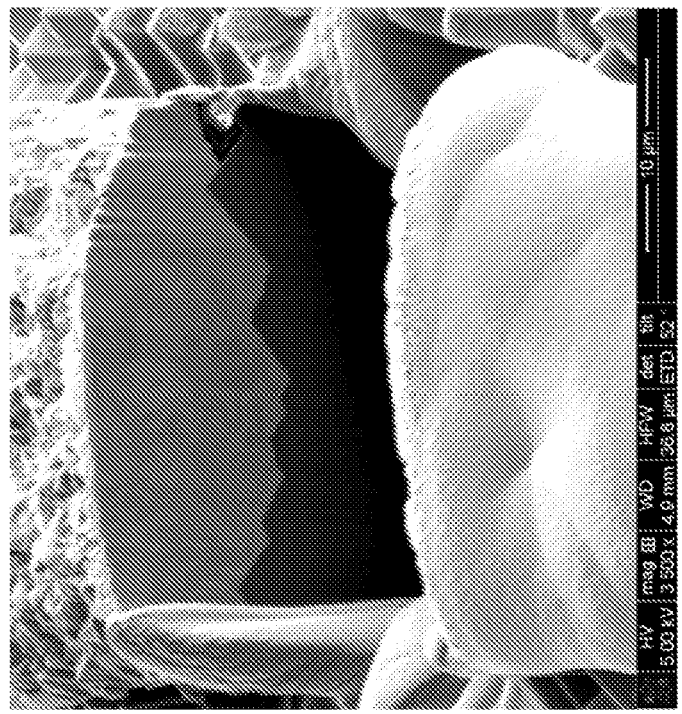
FIG. 5 shows images of metal fingers after adhesion testing.
Figure 5A:
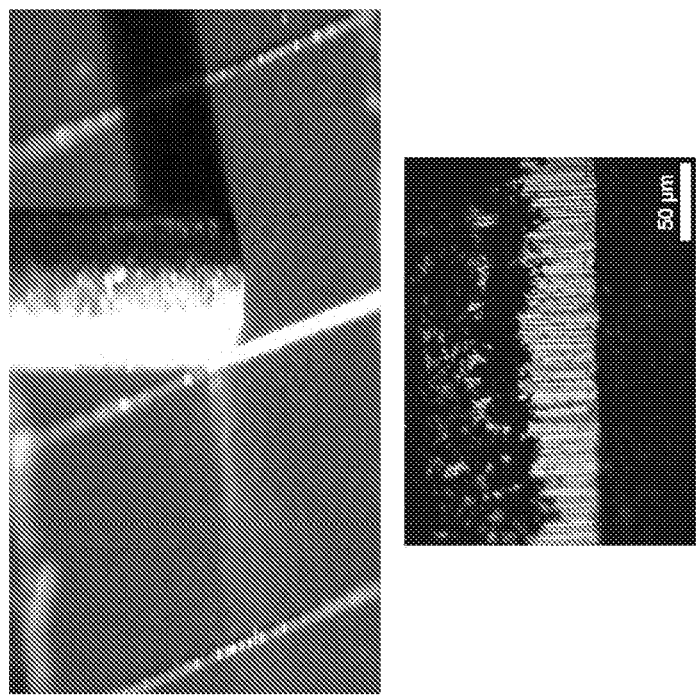

Referring now to FIG. 5(a), there is shown a microscope image of a finger after adhesion testing. The finger was cut off from the surface rather than becoming dislodged. FIG. 5(b) is a FIB cross-sectional image of a copper plated finger with a width of approximately 25 µm and a height of approximately 10 µm.

Figure 6B:
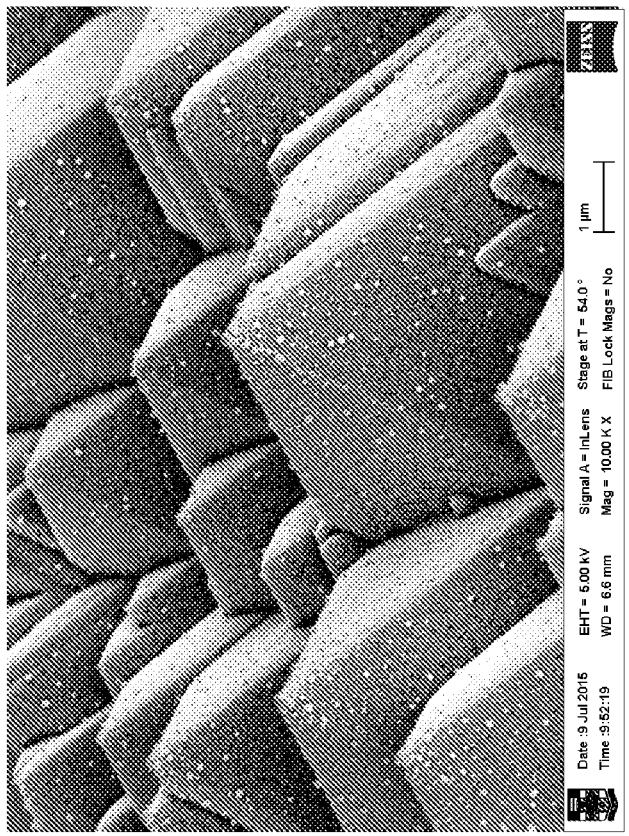
FIG. 6 shows SEM images of a surface of a solar cell before (a) and after treatment (b)
Figure 6A:
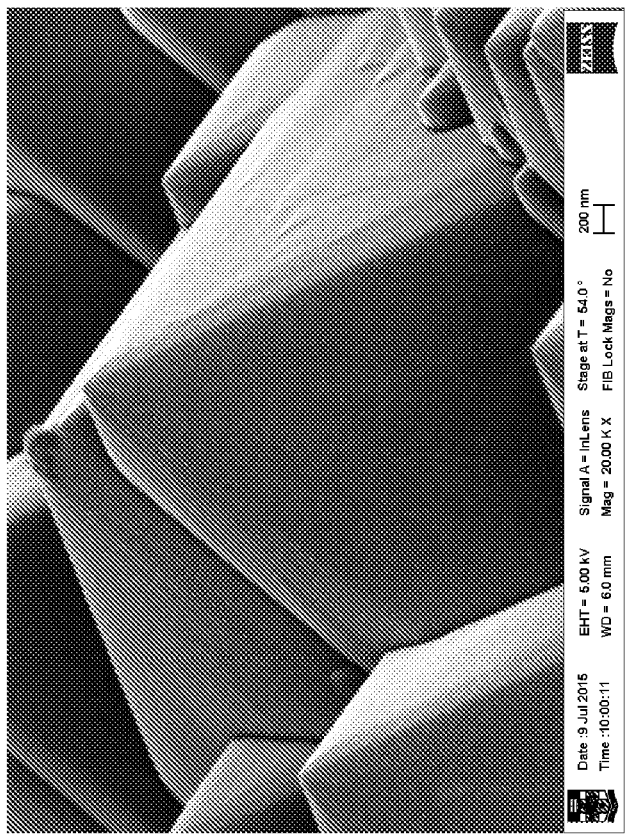

Referring now to FIG. 6, there are shown SEM images of the surface before (6a) and after treatment with a method in accordance with embodiments (6b).

Figure 7A:
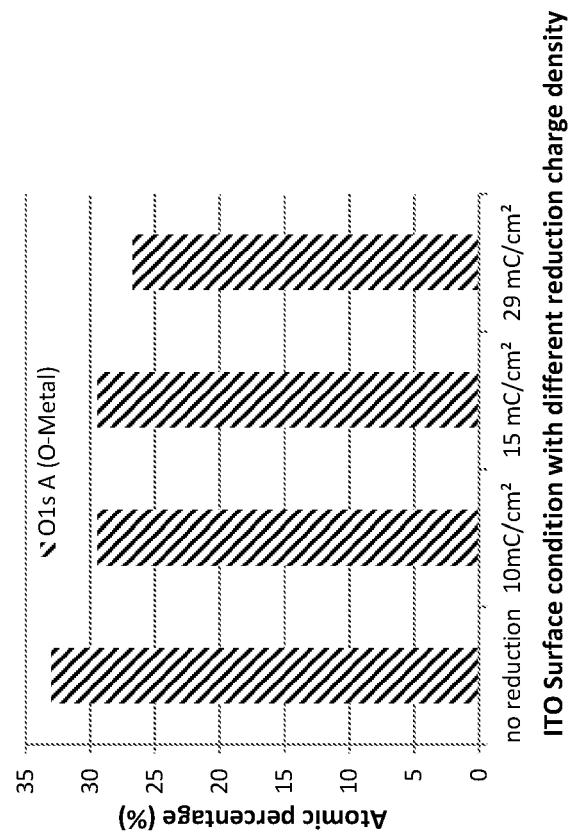
FIG. 7 shows two diagrams of the chemical surface condition of an ITO layer treated surface.

Referring now to FIG. 7, there are shown two diagrams of the chemical surface condition of an ITO layer treated in accordance with embodiments. FIG. 7(a) shows the atomic percentage of $SnO_2$, SnO and Sn on the surface of an ITO layer treated in accordance with embodiments for different charge density levels. The percentage of $Sn^{4+}$ ($SnO_2$) drops when the treatment charge density is increased. On the other hand, an increase of $Sn^{2+}$ (SnO) can be observed when the charge is increased and a small concentration of elemental Sn is shown when a charge density of 29 $mC/cm^2$ is used.

Figure 7B:
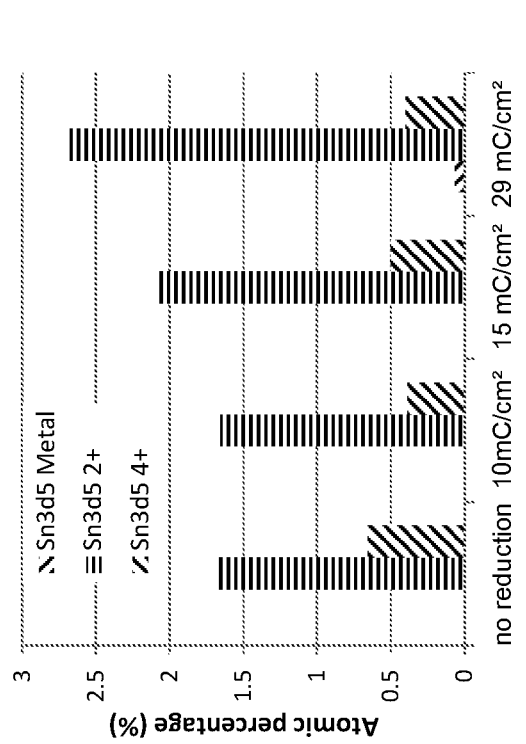

FIG. 7(b) confirms the result in FIG. 7(a) by showing a drop of metal-oxygen compounds concentration with the increase of the treatment charge density.

Any discussion of documents, acts, materials, devices, articles or the like which has been included in the present specification is not to be taken as an admission that any or all of these matters form part of the prior art base or were common general knowledge in the field relevant to the present invention as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

What is claimed is:

1. A method for treating a plurality of portions of a surface of a TCO layer in a semiconductor device, the semiconductor device comprising a structure arranged to facilitate current flow in one direction, the method comprising the steps of:
    exposing the plurality of surface portions of the TCO layer to an electrolyte, the exposed surface portions comprising finger portions for adherence with finger electrodes, there being a non-exposed surface region of the TCO layer between each pair of adjacent finger portions, the electrolyte being suitable for electrochemically reducing each exposed surface portion of the TCO layer when an electrical current is induced through the TCO layer; and
    inducing a current in the TCO layer by inducing a current in the semiconductor device, the induced current being directed transversally to the exposed surface portions of the TCO layer and being substantially uniform across all exposed surface portions of the surface of the TCO layer;
    wherein the substantially uniform induced current reduces the exposed surface portions of the TCO layer, such that the TCO layer includes TCO material at the exposed surface portions and the TCO material at the exposed surface portions has substantially uniformly reduced surfaces, and improves uniformity of adhesion of a metallic material to each exposed surface portion in comparison to adhesion of the metallic material to the non-exposed regions of the TCO layer;
    wherein the reduction at the plurality of exposed surface portions of the TCO layer is induced by exclusive contact of the exposed surface portions with the electrolyte.

2. The method of claim 1 wherein the structure arranged to facilitate current flow in one direction comprises a light absorbing layer and at least one carrier selective layer.

3. The method of claim 1 wherein the structure arranged to facilitate current flow in one direction comprises a p-n junction and the step of inducing a current in the TCO layer comprises the step of biasing the p-n junction.

4. The method of claim 3
    wherein the method further comprises the step of electrically interconnecting an electrode element to the semiconductor device and electrically interconnecting the electrode element to a wet electrode positioned for contacting the electrolyte so that the induced current can flow through an electrical circuit comprising: the electrolyte, the semiconductor device, the TCO layer; the electrode element and the wet electrode.

5. The method of claim 4 wherein the TCO layer is arranged as a continuous layer on an n-type or p-type region of the semiconductor device and the induced current flows in a direction transverse to the layer.

6. The method of claim 4 wherein the TCO layer is arranged as a continuous layer on an n-type region of the semiconductor device and the step of inducing a current in the TCO layer comprises the step of exposing a portion of the semiconductor device to electromagnetic radiation to induce a photo-generated current.

7. The method of claim 6 wherein the method further comprises the step of controlling a structural or electrical property of the surface of the TCO layer by modulating a property of the induced current.

8. The method of claim 7 wherein the property of the induced current is the magnitude of the induced current and is modulated by modulating the intensity of the radiation.

9. The method of claim 6 wherein the method further comprises the step of applying a voltage between the semiconductor device and an electrode in the electrolyte, the applied voltage being such to decrease the voltage drop induced by the electromagnetic radiation on the p-n junction.

10. The method of claim 4 wherein the TCO layer is arranged as a continuous layer on a p-type region of the semiconductor device and the step of inducing a current in the TCO layer comprises the step of applying a voltage between the semiconductor device and an electrode in the electrolyte, the applied voltage being such to forward bias the p-n junction.

11. The method of claim 9 wherein the method further comprises the step of controlling a structural or electrical property of the surface of the TCO layer by modulating a property of the applied voltage.

12. The method of claim 9 wherein the semiconductor device comprises an electrode element that is at least semi-transparent to the electromagnetic radiation and wherein the voltage is applied via the electrode element.

13. The method of claim 1 wherein the TCO layer is etched while the method is performed.

14. The method of claim 1 wherein a concentration of metallic elements in the TCO layer at its surface is increased while the method is performed, and wherein a roughness of the exposed portions is increased after the method is performed.

15. The method of claim 1 wherein the method further comprises the step of selecting a property of the electrolyte to influence a property of the surface of the TCO layer after treatment.

16. The method of claim 1 wherein the method further comprises the step of, prior to exposing the surface of the TCO layer to an electrolyte, forming a mask onto the TCO layer to define a patterned surface of the TCO layer to be exposed to the electrolyte.

17. The method of claim 1 wherein the semiconductor device is a silicon solar cell.

18. A method for plating a metallic material to a surface of a TCO layer in a semiconductor device, the semiconductor device comprising a p-n junction, the method comprising the steps of:

exposing a plurality of portions of the surface of the TCO layer to an electrolyte that is suitable for electrochemically reducing the TCO layer when an electrical current is induced through the TCO layer, the surface portions comprising finger portions for adherence with finger electrodes, there being a non-exposed surface region of the TCO layer between each pair of adjacent finger portions; and inducing a current in the TCO layer by biasing the p-n junction, the induced current being directed transversally to the exposed surface portions of the TCO layer and being substantially uniform across all exposed surface portions of the surface of the TCO layer;

allowing for the surface of the TCO layer to be reduced in a substantially uniform manner by the current and the electrolyte such that uniformity of adhesion of the metallic material to the exposed surface is improved; and plating the metallic material to the surface of the TCO layer;

wherein the reduction at the plurality of exposed surface portions of the TCO layer is induced by exclusive contact with the electrolyte.

* * * * *